(12) United States Patent
de Frutos et al.

(10) Patent No.: US 6,856,177 B1
(45) Date of Patent: Feb. 15, 2005

(54) HIGH SIDE POWER SWITCH WITH CHARGE PUMP AND BOOTSTRAP CAPACITOR

(75) Inventors: Xavier de Frutos, Venelles (FR); Bruno C. Nadd, Lourmari (FR); Vincent Thiery, Provence (FR); Chik Yam Lee, Courtaboeuf Cedex (FR)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/625,032

(22) Filed: Jul. 22, 2003

(51) Int. Cl.$^7$ ................................................. H03K 3/00
(52) U.S. Cl. ........................ 327/108; 327/390; 327/589
(58) Field of Search ...................... 327/108–112, 390, 327/589

(56) References Cited

U.S. PATENT DOCUMENTS

| | | | | |
|---|---|---|---|---|
| 4,570,244 A | * | 2/1986 | Sud et al. | 365/230.06 |
| 4,634,894 A | * | 1/1987 | Shu et al. | 327/537 |
| 5,359,244 A | * | 10/1994 | Hopkins | 327/434 |
| 5,408,150 A | * | 4/1995 | Wilcox | 327/108 |
| 5,946,204 A | * | 8/1999 | Wong | 363/60 |
| 6,169,431 B1 | * | 1/2001 | Xu | 327/109 |

FOREIGN PATENT DOCUMENTS

GB  2180422 A  *  3/1987

* cited by examiner

*Primary Examiner*—Kenneth B. Wells
(74) *Attorney, Agent, or Firm*—Ostrolenk, Faber, Gerb & Soffen, LLP

(57) ABSTRACT

A power switching circuit comprising a power semiconductor switching device, a charge pump circuit having a control input to control whether it is on or off and a charge pump output, the charge pump output being coupled to a control terminal of the power semiconductor switching device, a bootstrap power supply for supplying power to driver circuitry for the power semiconductor switching device, the bootstrap power supply comprising a bootstrap capacitor coupled to a charging current source, the bootstrap power supply providing power to the driver circuitry when the power semiconductor switching device is being switched by the driver circuitry in a pulsed mode, and the charge pump supplying a control voltage to turn on the power semiconductor switching device and maintain it on when the power switching semiconductor device is to be maintained on continuously.

7 Claims, 1 Drawing Sheet

HIGH SIDE POWER SWITCH WITH CHARGE PUMP AND BOOTSTRAP CAPACITOR

BACKGROUND OF THE INVENTION

The present invention relates to power switches, and in particular to semiconductor power switches, particularly power MOSFET switches. The present invention has particular application to intelligent power switches which are power switching devices that include intelligent protective circuits to prevent damage in the event of overtemperature and overcurrent conditions.

Intelligent power switches employ charge pumps which are well known circuits to charge current into the gate of the power switching device in order to maintain the power switch on continuously. In particular, charge pumps are necessary for high side NMOS switches when a voltage above the supply voltage needs to be generated. Further, in a pulsed mode of operation, the maximum frequency of operation of intelligent power switches has been limited to about 1 khz for silicon integrated charge pumps because pump capacitor values are small and cannot generate large gate currents even when operating in the MHz range.

It would be desirable to provide a power switching device, for example, an intelligent power switching device, which is capable of continuous on operation, when desired, and which can also be switched at frequencies much higher than heretofore possible, for example, in the range up to 20 kHz to 50 kHz.

It is furthermore desirable to provide such a power switching device that is suitable for use in an automotive environment.

SUMMARY OF THE INVENTION

It is an object of the present invention to provide a power switching device which is capable of continuous on operation, when desired, and which is also capable of high speed switching operations, for example, pulse width modulated switching operations of, for example, 20 kHz to 50 kHz.

The above and other objects of the invention are achieved by a power switching circuit comprising, a power semiconductor switching device, a charge pump circuit having a control input to control whether the charge pump is on or off and a charge pump output, the charge pump output being coupled to a control terminal of the power semiconductor switching device, a bootstrap power supply for supplying power to driver circuitry for the power semiconductor switching device, the bootstrap power supply comprising a bootstrap capacitor coupled to a charging current source, the bootstrap power supply providing power to the driver circuitry when the power semiconductor switching device is being switched by the driver circuitry in a pulsed mode and the charge pump supplying a control voltage to turn on the power semiconductor switching device and maintain it on when the power switching device is to be maintained on continuously.

The objects of the invention are also achieved by a method for switching a power semiconductor, comprising, generating a voltage from a charge pump circuit having a control input to control whether the charge pump circuit is on or off and selective providing the voltage to a control terminal of the power semiconductor, charging a bootstrap capacitor of a bootstrap power supply when the power semiconductor is being switched by the drive circuitry in a pulsed mode, providing power to the driver circuitry from the bootstrap power supply when the power semiconductor is being switched by the driver circuitry in the pulsed mode, and supplying a control voltage from the charge pump circuit to turn on the power semiconductor and maintain it on when the power semiconductor is to be maintained continuously.

Other objects, features and advantages of the present invention will become apparent from the following detailed description.

BRIEF DESCRIPTION OF THE DRAWING(S)

The invention will be described in greater detail in the following detailed description with reference to the drawings, in which.

DETAILED DESCRIPTION OF EMBODIMENTS OF THE INVENTION

Figure 1:
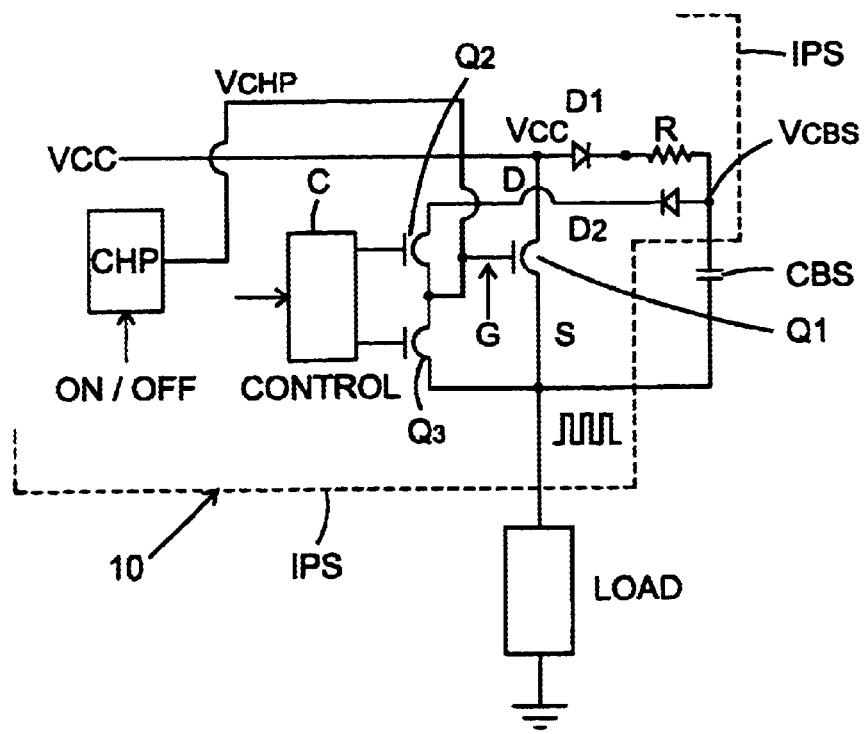
FIG. 1 is a schematic diagram of the circuit according to the present invention.

With reference now to the drawings, FIG. 1 shows a circuit according to the present invention. All components, with the exception of the load and the capacitor CBS, can be integrated into an integrated circuit denominated IPS in FIG. 1. IPS is an abbreviation for "intelligent power switch".

The circuit according to the present invention comprises a power switch 10 including a main power switching device Q1, typically driven by a driver circuit employing two transistors Q2 and Q3 in a half bridge arrangement. The gate of transistor Q1 is driven by the common node between transistors Q2 and Q3.

The drain of transistor Q1 is connected, in typical fashion to the voltage source VCC. The anode of a diode D1 is connected to the voltage source VCC in series with a resistor R. The other end of the resistor R is coupled to a bootstrap capacitor CBS. A second diode D2 has its anode coupled to the common junction of resistor R and capacitor CBS. The cathode of diode D2 is connected to provide a bootstrap voltage source to transistors Q2 and Q3. The switch 10 shown in FIG. 1 is a high side switch, that is, it switches the high side voltage VCC through the load as shown to ground.

Transistors Q2 an Q3 are controlled by a control circuit C in conventional fashion. In addition, a charge pump CHP is provided controlled by an on/off signal which also controls the control C. The output of the charge pump is a fixed voltage above that which is coupled to the gate of transistor Q1. The charge pump is a known circuit.

The circuit operates as follows. During high speed switching of transistor Q1, a pulsed voltage will be provided to the load. Capacitor CBS can only charge substantially through diode D1 and resistor R when transistor Q1 is off. When transistor Q1 is on, the voltage between drain and source is substantially zero and accordingly, capacitor CBS will not charge substantially during that period. When transistor Q1 is off, however, capacitor CBS can charge through the load through diode D1 and resistor R to a voltage VCBS with respect to ground. The voltage VCBS is supplied via diode D2 to the drive circuit comprising transistors Q2 and Q3 as the high side voltage source for the half bridge comprising transistors Q2 and Q3. The bootstrap capacitor CBS can charge to an adequate voltage even at a high switching frequency of 20 to 50 khz of transistor Q1, thereby providing a power source to transistors Q2 and Q3.

When transistor Q1 is controlled on continuously, however, i.e., when not being turned on and off by a pulsed signal, the voltage across the drain and source of transistor Q1 drops to substantially zero, and capacitor CBS cannot charge substantially during this time period. Capacitor CBS cannot charge and will be discharged until VCBS=VGSQ1+VFD2 and may be fully discharged if the IC sinks current from capacitor CBS or due to capacitor CBS leakage. VFD2 is the diode D2 forward voltage drop. In such circumstance, a charge pump CHP is provided which is turned on when transistor Q1 is in a continuous conduction state. The voltage VCHP from the output of the charge pump is coupled to the gate of transistor Q1, thereby maintaining transistor Q1 in a continuous on condition.

Accordingly, the circuit of the present invention provides in a power switching device, the ability to switch the power switching device at high frequencies and yet, when desired, allow the power switching device to be maintained in a continuous conduction mode.

Figure 2:
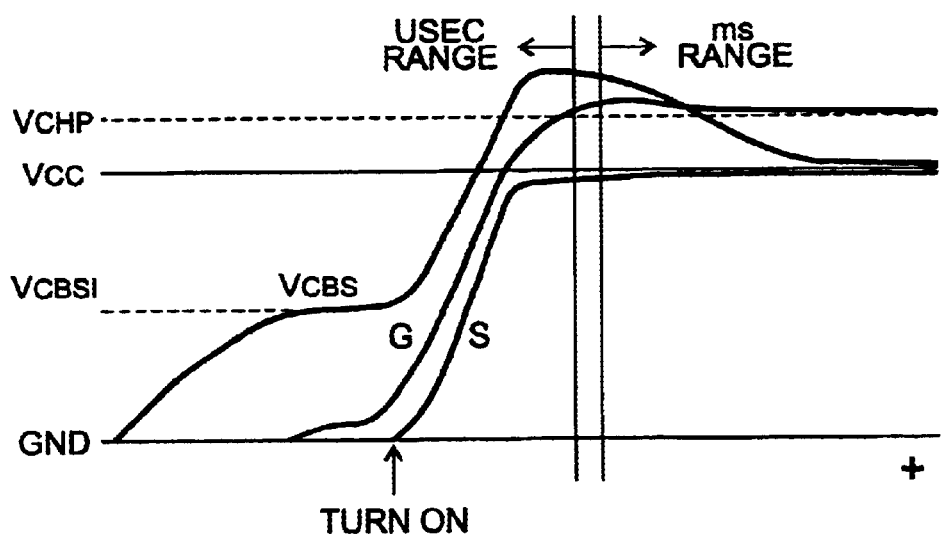
FIG. 2 is a graph showing the operation of the circuit according to the present invention.

FIG. 2 shows the operation of the circuit according to the present invention graphically. During the period prior to turn on of the power switch Q1, capacitor CBS charges up to an intermediate voltage VCBSI as determined by the voltage divider comprising the series circuit including the diode D1, resistor R, the capacitor CBS and the load. When the transistor Q1 is turned on, the gate voltage increases as shown in FIG. 2 to a voltage depending on VCBS and the ratio of capacitance CBS to the MOSFET parasitic capacitance CQ1. In the long term, if capacitor CBS discharges [self discharge or if it is used to supply the IC] the charge pump will keep VGSQ1=VCHP for any VCBS since current from the charge pump is blocked by D2 from flowing to capacitor CBS An advantage of this configuration of the charge pump, diode and capacitor CBS is that reliability is increased compared to using a charge pump to keep capacitor CBS charged. In this latter case, ICHP must exceed leakage current in capacitor CBS, that is, Ileak CBS<ICHP≅a few $\mu$A. Only expensive capacitors and good mounting can meet this condition, particularly in an automotive environment. Thus, according to the present invention, the charge pump, which provides a relatively small current, is not used to charge the bootstrap capacitor CBS. The diode D2 blocks the charge pump from charging the bootstrap capacitor. As the transistor Q1 turns on, the source follows and reaches voltage VCC as shown in FIG. 2. The voltage VCBS, measured with respect to ground, will also increase. As the source voltage rises, VCBS rises above the source voltage by the amount of the charge VCBSI on the capacitor CBS prior to turn on of transistor Q1. This is shown in FIG. 2.

Diode D2 need not be an actual diode, that is, Q2 may be actively controlled to avoid current flowing to capacitor CBS. This avoids a voltage drop VFD2 and reduces power consumption and allows operation at lower battery voltage.

Accordingly, there has been described a power switching circuit incorporating a charge pump and a bootstrap power supply which enables the switching circuit to operate both in a continuous on mode and at switching frequencies in the area of 20 to 50 khz.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A power switching circuit comprising:
    a power semiconductor switching device;
    a charge pump circuit having a control input to control whether the charge pump is on or off and a charge pump output, the charge pump output being coupled to a control terminal of the power semiconductor switching device;
    a bootstrap power supply for supplying power to driver circuitry for the power semiconductor switching device, the bootstrap power supply comprising a bootstrap capacitor coupled to a charging current source;
    the bootstrap power supply providing power to the driver circuitry when the power semiconductor switching device is being switched by the driver circuitry in a pulsed mode; and
    the charge pump supplying a control voltage to turn on the power semiconductor switching device and maintain it on when the power switching device is to be maintained on continuously; and wherein a transistor switch of the driver circuitry is actively controlled to prevent the charge pump from charging the bootstrap capacitor.

2. The power switching circuit of claim 1, wherein the bootstrap capacitor is coupled to the charging current source by a first diode.

3. The power switching circuit of claim 2, wherein the bootstrap capacitor is coupled in series with a charging resistor.

4. The power switching circuit of claim 1, wherein the bootstrap capacitor charges from the charging current source through a load coupled to the power switching device.

5. The power switching circuit of claim 1, wherein the power switching device is a high side switching device coupling the load to a voltage source.

6. The power switching circuit of claim 1, wherein the power switching device comprises a MOSFET.

7. A method for switching a power semiconductor, comprising:
    generating a voltage from a charge pump circuit having a control input to control whether the charge pump circuit is on or off and selective providing the voltage to a control terminal of the power semiconductor;
    charging a bootstrap capacitor of a bootstrap power supply when the power semiconductor is being switched by the driver circuitry in a pulsed mode;
    providing power to the driver circuitry from the bootstrap power supply when the power semiconductor is being switched by the driver circuitry in the pulsed mode; and
    supplying a control voltage from the charge pump circuit to turn on the power semiconductor and maintain it on when the power semiconductor is to be maintained continuously; and
    preventing charging of said bootstrap capacitor by said charge pump circuit by actively controlling a transistor switch of the driver circuitry.

* * * * *